US006624998B2

(12) United States Patent
May et al.

(10) Patent No.: US 6,624,998 B2
(45) Date of Patent: Sep. 23, 2003

(54) ELECTROSTATIC DISCHARGE PROTECTION SCHEME IN LOW POTENTIAL DROP ENVIRONMENTS

(75) Inventors: James Thomas May, Tempe, AZ (US); Larry Earl Tyler, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 268 days.

(21) Appl. No.: 09/768,715

(22) Filed: Jan. 24, 2001

(65) Prior Publication Data

US 2001/0024348 A1 Sep. 27, 2001

Related U.S. Application Data

(60) Provisional application No. 60/177,763, filed on Jan. 24, 2000.

(51) Int. Cl.$^7$ .................................................. H02H 3/22
(52) U.S. Cl. ................................. 361/111; 361/56
(58) Field of Search ........................ 361/56, 111, 54

(56) References Cited

U.S. PATENT DOCUMENTS

| | | | |
|---|---|---|---|
| 4,692,834 A | 9/1987 | Iwahashi et al. ............... 361/91 |
| 5,237,395 A | 8/1993 | Lee ............................. 257/358 |
| 5,287,241 A | 2/1994 | Puar ............................ 361/56 |
| 5,473,500 A | 12/1995 | Payne et al. .................. 361/111 |
| 5,530,612 A | 6/1996 | Maloney ....................... 361/56 |
| 5,584,870 A | 12/1996 | Single et al. ................... 607/63 |
| 5,610,790 A | 3/1997 | Staab et al. .................... 361/56 |
| 5,610,791 A | 3/1997 | Voldman ....................... 361/56 |
| 5,617,283 A | 4/1997 | Krakauer et al. .............. 361/56 |
| 5,637,892 A | 6/1997 | Leach ........................... 257/362 |
| 5,644,460 A | 7/1997 | Clukey .......................... 361/56 |
| 5,654,574 A | 8/1997 | Williams et al. ............. 257/355 |
| 5,721,656 A | * 2/1998 | Wu et al. ...................... 361/56 |
| 5,731,940 A | * 3/1998 | Minogue ....................... 361/56 |
| 5,945,713 A | 8/1999 | Voldman ....................... 257/355 |
| 5,946,176 A | 8/1999 | Ghoshal ........................ 361/56 |
| 6,104,588 A | * 8/2000 | Hariton et al. ............... 361/111 |
| 6,144,542 A | * 11/2000 | Ker et al. .................... 361/111 |
| 6,388,857 B1 | * 5/2002 | Sato et al. .................... 361/111 |

* cited by examiner

*Primary Examiner*—Kim Huynh
(74) *Attorney, Agent, or Firm*—Girma Wolde-Michael; Daniel G. Chapik

(57) ABSTRACT

Electrostatic Discharge (ESD) protection scheme includes a divided rail structure to route damaging ESD away from sensitive circuitry. Specifically, $V_{dd}$ and $V_{ss}$ rails are divided to segregate the ESD current within a circuit, thus isolating the sensitive circuitry from ESD exposure. In an exemplary embodiment, $V_{dd}$ is divided into $V_{dd}$-esd and $V_{dd}$ core, while $V_{ss}$ is divided into $V_{ss}$-esd and $V_{ss}$ core. The structure in cooperation with diodes, clamps and resistors enables to isolate the rails ($V_{dd}$ core and $V_{ss}$ core) associated with sensitive circuitry from ESD current.

4 Claims, 2 Drawing Sheets

ELECTROSTATIC DISCHARGE PROTECTION SCHEME IN LOW POTENTIAL DROP ENVIRONMENTS

This application claims the benefit of Provisional Application No. 60/177,763, filed Jan. 24, 2000.

FIELD OF THE INVENTION

The present invention generally relates to the control and attenuation of electrostatic discharge (ESD) to prevent damage to integrated circuits (IC). The invention enables isolation of ICs from voltage drops caused by ESD current. More specifically, the invention implements a divided rail concept to strategically direct undesirable ESD current away from sensitive circuitry.

BACKGROUND OF THE INVENTION

Integrated circuits (ICs) normally require a special electrostatic discharge (ESD) protection circuit for all pads. ESD is a discharge of static electricity that can destroy sensitive electronic devices and circuitry unless major steps are taken to prevent its occurrence. ESDs are generally stored on non-conductive surfaces and dielectric components of IC devices. Both discreet semi-conductor devices and integrated circuits may be damaged by ESD. Specifically, as ICs have achieved a higher speed, smaller geometries, lower power and lower voltage, they have become more susceptible to ESD damage.

Prior art ESD protection circuit systems include special low impedance elements such as, for example, forward biased diodes or snap back devices that route the ESD current to one of two power supply rails, depending upon the polarity of the ESD pulse. In these systems, typically, the ESD current is directed through a power supply rail to complete the ESD discharge circuits. For normal operation of an IC, the voltage, at any point along a metal rail, is the same as any other point within a difference of a few millivolts. However, during an ESD episode, the interconnect conducts a large ESD current. This may include sizeable and potentially destructive voltage drops along the interconnect because of the large ESD current flowing through the resistance of the metal rail.

Regarding the prior art, ESD protection circuits operate under a high voltage potential and would cause irreversible damage if used in small potential circuits. For example, U.S. Pat. No. 4,692,834 to Iwashi et al, discloses an electrostatic discharge protection circuit with variable limiting thresholds for MOS device. Specifically, the invention relates to the protection from over voltage damage, a MOS input device which is to be responsive to a high voltage input signal. The invention implements a variable limiting threshold for an input signal as part of the electrostatic discharge protection circuit. Specifically, the invention utilizes a gate controlled diode utilizing a gate controlled drain avalanche breakdown. In this embodiment, a preselected potential is continuously or optionally applied to the gates of the gate controlled diode from the exterior or interior of the integrated circuit, so that the potential limiting threshold for the input signal is enhanced. Thereafter, a high voltage input signal for the MOS input semiconductor integrated circuit is free from potential limiting operation and the integrated circuit can receive the information of the high voltage input signal.

Further, U.S. Pat. No. 5,237,395 to Lee, discloses a power rail ESD protection circuit. Specifically, first and second current shunt passes between the power rails are maintained non-conductive during normal circuit operation, and are triggered to a conductive mode in response to an ESD event on the power rail. A triggering circuit may employ a logic gate such as an inverter, with its input coupled to the positive power rail that maintains a low level output during normal operation and provides a high output in response to an ESD event on the power rail.

U.S. Pat. No. 5,287,241 to Puar, discloses a shunt circuit for electrostatic discharge protection. Specifically, the invention discloses a circuit that is added to a complementary metal oxide silicone (CMOS) integrated circuit (IC) to provide an intentional non-reversed biased $V_{dd}$ to $V_{ss}$ shunt pass for transient currents such as electrostatic discharges. The circuit protects the IC from ESD damage by turning on before any other pass, thus directing the ESD transient current away from easily damaged structures. More specifically, the ESD transient current is steered from the VVD rail to the $V_{ss}$ rail through the on conduction of a P-channel transistor whose source and drain are connected to $V_{dd}$ and $V_{ss}$ respectively. The voltage on the gate of this transistor follows the $V_{dd}$ supply rail because it is driven by a delay network formed by a second transistor in a capacitor. This $V_{dd}$ tracking delay network turns the $V_{dd}$ to $V_{ss}$ transistor on during a transient and off during normal operation of the IC.

U.S. Pat. No. 5,473,500 to Payne et al, relates to electrostatic discharge circuits for high speed, high voltage circuitry. Specifically, the invention relates to a protection circuit which includes a first controlled path for discharging negative ESD pulses introduced at the signal node. The first controlled path is from the signal node to $V_{cc}$ via the source and drain electrodes of a first transistor. The gate of the transistor is at a soft ground by connection of the gate through a resistor and an inverter to a fixed voltage supply potential ($V_{cc}$). A second controlled path discharges positive ESD pulses via source and drain regions of serially connected second and third transistors to ground. The second transistor has a ate tied at $V_{cc}$ by means of a resistor and inverter to ground. The third transistor is at soft ground by means of a resistor and inverter to $V_{cc}$. The third transistor is turned on by a positive voltage exceeding the threshold voltage of the third transistor. The protection circuit may include a third controlled path through a fourth transistor, if low voltage circuitry is tied to the signal node. The fourth transistor includes a gate that is tied high by connection of the gate to ground via transistor and inverter.

U.S. Pat. No. 5,530,612 to Maloney, relates to electrostatic discharge protection circuits using biased and terminated PNP transistor chains. Specifically, the disclosure relates to a bias network that is used to augment the diode string to distribute small but significant forward current to the diodes. Also disclosed is the use of cantilever diodes which provide PNP Darlington gain block for ESD protection rather than for amplifying signals in bipolar ICs. In one disclosure, the termination is the principal element of device novelty and that which makes the protection device "stand-alone". The termination supplies final base current to the gain block for a limited amount of time, so that ESD charge can be shunted harmlessly through the PNP chain, but assures that the structure draws no current from a stable power supply long term. The entire structure is able to absorb noise spikes as well as ESD pulses. The termination also makes provisions for discharging its capacitor between ESD pulses, as is necessary for standardized testing. The invention is specifically suited for an IC power supply clamp, and reduces the damage often seen on IC C power supplies during extensive ESD testing.

U.S. Pat. No. 5,584,870 to Single et al, describes an implant ESD protection network. Specifically, the invention relates to a protective component that is provided for protecting a cochlear implant from external electrostatic discharges. The implant receives signals through a receiver coil inductively coupled to a transmitter coil. The protective component is disposed across the coil of the transmitter.

U.S. Pat. No. 5,644,460 to Clukey, discloses a multi-rail electrostatic discharge protection device. The invention relates to a device for protecting against circuit damaging voltage spikes at input nodes and output nodes of electrical circuits and between high and low potential power rails. The voltage spikes are of the type identified generally as electrostatic discharges. The device includes a plurality of semiconductor elements which are preferably bipolar transistors, coupled to the power rails and an input node or an output node of the circuit such that all types of electrostatic discharges can be diverted using the single device of the present invention. In a preferred embodiment, the transistors have a common collector, their bases are open, and they are configured so that the emitter of one transistor is coupled to a high potential power rail. The emitter of a second transistor is coupled to a low potential rail, and the emitter of a third transistor is coupled to the node to be protected. Various combinations of the breakdown characteristics of the several coupled transistors operate to divert various types of voltage spikes, including positive and negative spikes at the node, and positive and negative spikes between the power rails.

U.S. Pat. No. 5,610,790 to Staab et al, discloses a method and structure for providing ESD protection for silicone on insulator integrated circuits. The ESD protection circuit includes an electrically conductive pad and first conductor segment fabricated over an insulating layer. The first conductor segment connects the pad directly to a first node, without an intervening input resistor. A first diode is fabricated over an insulating layer and connected between the first node and a first voltage supply rail. Similarly, a second diode is fabricated over the insulating layer and connected between the first node and a second voltage supply rail. Ballast resistors can be included in series with each of the diodes. A cross power supply clamp, also fabricated over the insulating layer, is connected between the first and second voltage supply rails. The first node of the ESD protection circuit is coupled to the SOI integrated circuit to be protected. The ESD protection circuit can be fabricated on a minimum number of silicon islands to improve local thermal spreading. Improved ESD protection is provided to input, output and I/O pins of an SOI integrated circuit, while promoting high speed signal transfer between these pins and the integrated circuit.

U.S. Pat. No. 5,610,791 to Voldman, discloses a power sequence independent electrostatic discharge protection circuits. The invention provides ESD protection in an IC chip having multiple power supply rails. The ESD protection circuitry protects each power supply rail from an ESD impulse with respect to ground and with respect to the other power supply rails. The ESD protection circuitry is power sequence independent thereby eliminating any restrictions on the sequencing of power as applied to, and removed from, the different power supply rails of the IC chip. A discharge device is controlled by a biasing device such that ESD impulses are passed through the discharge device, but power supply current is not passed therethrough during power sequencing.

U.S. Pat. No. 5,617,283 to Krakauer et al, discloses a self-referencing modulation circuit for CMSOS integrated circuit electrostatic discharge protection clamps. The modulation circuit in this invention includes a diode stack coupled to a resistor and further coupled to an inverter powered by the signal pad voltage in one embodiment, or an odd plurality of series connected inverters powered by the signal pad voltage in al alternate embodiment. The inverter chain is coupled to the esd clamp. The modulation circuit requires no reference supply voltage to operate. The ESD protection circuit shunts currents associated with ESD events away from the ICs as well as clamping I/O pad voltages to acceptable levels during an ESD event.

U.S. Pat. No. 5,637,892 to Leach, discloses an electrostatic discharge protection in integrated circuits, systems and methods. The system includes a semiconductor die with a substrate and at least first and second bond pads. An internal circuit is fabricated on the semiconductor die and connected to the first bond pad. An electrostatic discharge protection circuit including cascaded bipolar transistors is connected in series with a field effect transistor between the first and second bond pads. In another version, an output buffer of the integrated circuit is divided into sections. An electrostatic discharge protection circuit is triggerable in response to a voltage in the substrate. Resistive connections are provided from the sections of the output buffer to one of the bond pads. The output buffer is operative upon an electrostatic discharge event to inject sufficient charge into the substrate to produce the voltage to trigger the electrostatic discharge protection circuit.

U.S. Pat. No. 5,654,574 to Williams et al, discloses an electrostatic discharge protection device for integrated circuits. The system includes a pair of depletion mode MOSFETs connected drain-to-drain in a series path between an input terminal and an output terminal, the gate of each MOSFET being connected to its source. A first diode having a relatively high breakdown voltage is connected between ground and the common drain terminal of the MOSFETs and a second diode having a relatively low breakdown voltage is connected between ground and the output terminal of the device. The second diode breaks down during a relatively low, long-lived voltage spike while the second MOSFET saturates, liming the size of the current through the second diode. The first diode breaks down during a large voltage spike of short duration, such as occurs from an ESD.

U.S. Pat. No. 5,945,713 to Voldman, discloses electrostatic discharge protection circuits for mixed voltage interface and multi-rail applications. Generally, the invention includes a circuit comprising a first well biased through an EFET so that the ESD circuit is not forward by normal operation when the voltage on the pad rises above a rail voltage.

U.S. Pat. No. 5,946,176 to Ghoshal, discloses an electrostatic discharge protection utilizing microelectromechanical switch. The invention provides a circuit formed within a semiconductor substrate. The circuit has an input and a ground. A voltage activated microelectromechanical switch is fabricated within the semiconducting substrate utilizing integrated circuit techniques. The microelectromechanical switch is coupled across the circuit input and the circuit ground. The voltage activated microelectromechanical switch couples the circuit input to the circuit ground when an electrostatic discharge voltage of sufficient magnitude is applied to the input of the circuit such that electrostatic discharge is dissipated to ground through the microelectromechanical switch thereby protecting the circuit from ESD.

Accordingly, there is a need to route most of the large ESD current away from sensitive core and through the ESD interconnects. Since the core rails conduct only a small fraction of the total ESD current, the voltage drops associated with the core circuitry is reduced to a small, harmless level.

SUMMARY OF THE INVENTION

The present invention relates to ESD protection systems incorporated in a circuit. The system, preferably, implements a divided rail scheme in which large ESD currents are directed away from sensitive circuitry. Specifically, the invention provides a divided rail structure and associated diodes, clamps and resistors that manage the routing of destructive ESD currents through the ESD interconnects.

As is well known in the art, the voltage (potential) at any point along a rail is constant. However, when an ESD is encountered, the interconnects develop substantial voltage drops due to current flowing through the rail resistance. This voltage drop presents a serious hazard to sensitive circuits. The present invention implements the divided rail scheme to segregate the voltage drop to be confined in a rail structure adopted to absorb and attenuate the high voltage ESD. Specifically, the divided rail scheme of the present invention, inter alia, includes the bifurcation of the $V_{dd}$ and $V_{ss}$ rails. As used herein, the term "rail" refers to a wide variety of metal interconnect that conduct current from bonding pads to the circuitry.

In an exemplary embodiment, the divided rail scheme of the present invention provides a structure in which the $V_{dd}$ rail is divided into $V_{dd}$-esd and $V_{dd}$-core. Similarly, $V_{ss}$ rail is divided into $V_{ss}$-esd and $V_{ss}$-core. The $V_{dd}$-esd and $V_{ss}$-esd rails and associated circuitry are designed to absorb ESD discharge and hand-off modified, ESD-disabled current to $V_{dd}$-core and $V_{ss}$-core thus protecting sensitive circuitry.

DETAILED DESCRIPTION OF THE DRAWINGS

Figure 1:
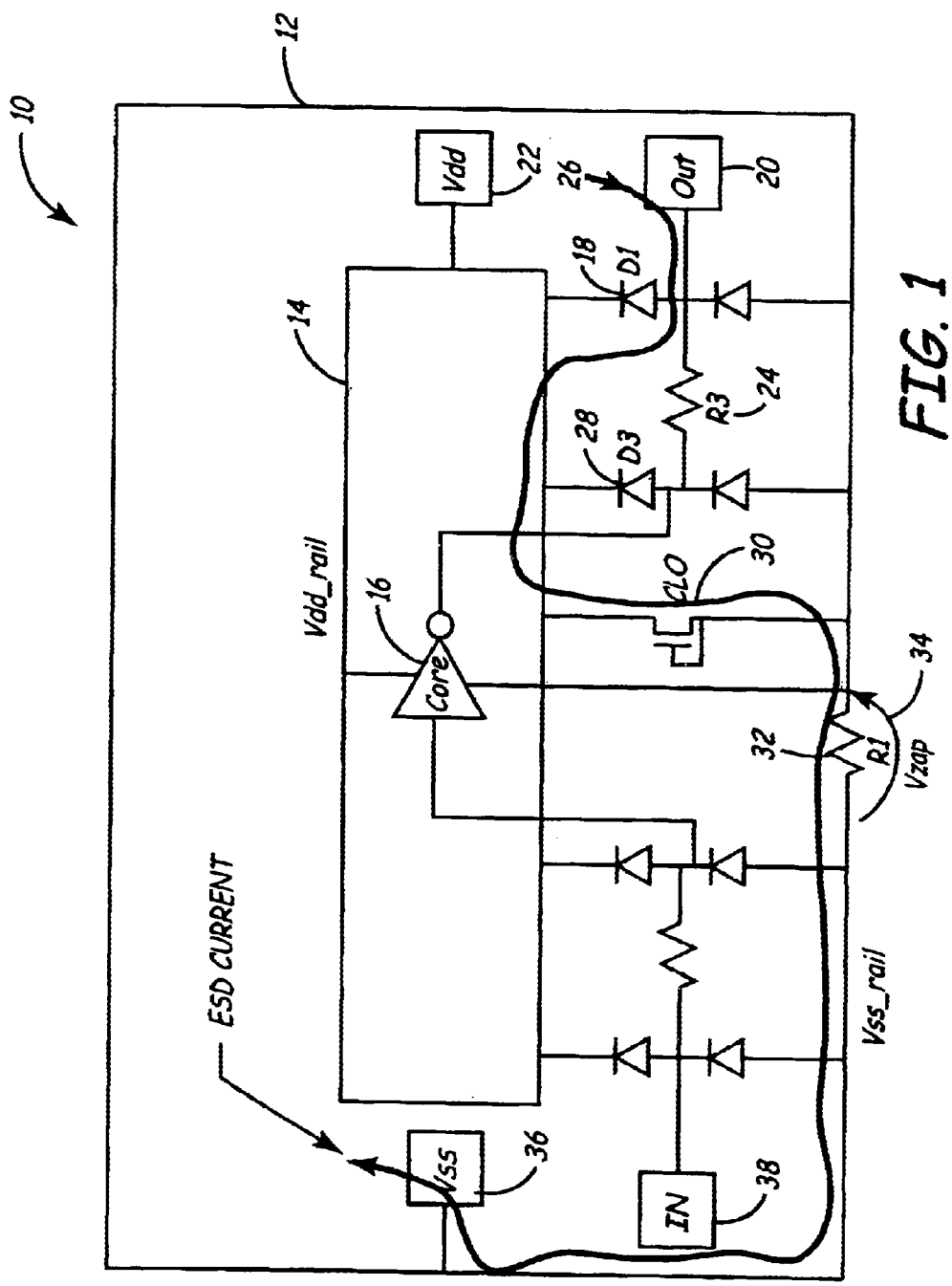
FIG. 1 represents the conventional ESD protection circuit.

Referring to FIG. 1, ESD protection circuit 10 including external rail 12 and internal rail 14 are shown. Further, core circuitry 16 representing highly sensitive IC consisting of amplifiers, logic gates and similar devices is disposed within rail 14. Generally, core 16 is independent of the ESD protection circuit. As discussed hereinabove the purpose of ESD protection circuitry is to prevent damage to sensitive elements residing in core 16. In operation, primary diode 18 conducts large ESD current pulses from output bonding pad 20 to $V_{dd}$ rail 22 for positive ESD pulses. Output isolation resistor 24 connected between output bonding pad 20 and output of core circuitry 16 diverts the ESD current 26 to rails 14 and 12, thus directing the current away from core circuitry 16 and the rails for both positive and negative ESD pulses. Secondary diode 28 is implemented to conduct small ESD currents that flow through output isolation resistor 24 to rail 14 for positive ESD pulses. Clamp 30 is a low impedance energy absorbing ESD current path from rail 14 to rail 12 for positive pulses. The resistance of a section of rail 12 is represented by resistance 32. Further, the voltage developed across resistance 32 arising from the ESD current pulse is represented by Vzap 34. $V_{ss}$ 36 is a bonding pad that connects rail 12 to the anodes of all ESD diodes and the negative side of esd clamp 30. Similarly, $V_{dd}$ 22 connects rail 14 to the cathodes of all ESD diodes and the positive side of clamp 30.

One of the limitations of the ESD protection circuit in FIG. 1, representing the prior art, is the fact that the protection provided to core circuitry 16 is neither reliable nor sufficient to ensure adequate protection for sensitive devices. For example, consider the case in which a 30-amp ESD current pulse enters at output bonding pad 20 and exits at $V_{ss}$ bonding pad 36. Using a rail resistance of 2 ohm at resistance 32 and representing the unwanted voltage rise caused by the ESD current as Vzap 34, the potential drop across resistor 32 could be calculated. Specifically, Vzap 34 has a value of 60 volts which is a potential drop caused by 30 amp through the 2 ohm rail resistance 32. Thus, under this scenario, rail 14 may be exposed to a current of 30 amps which may be destructive to the sensitive devices in core circuitry 16.

Figure 2:
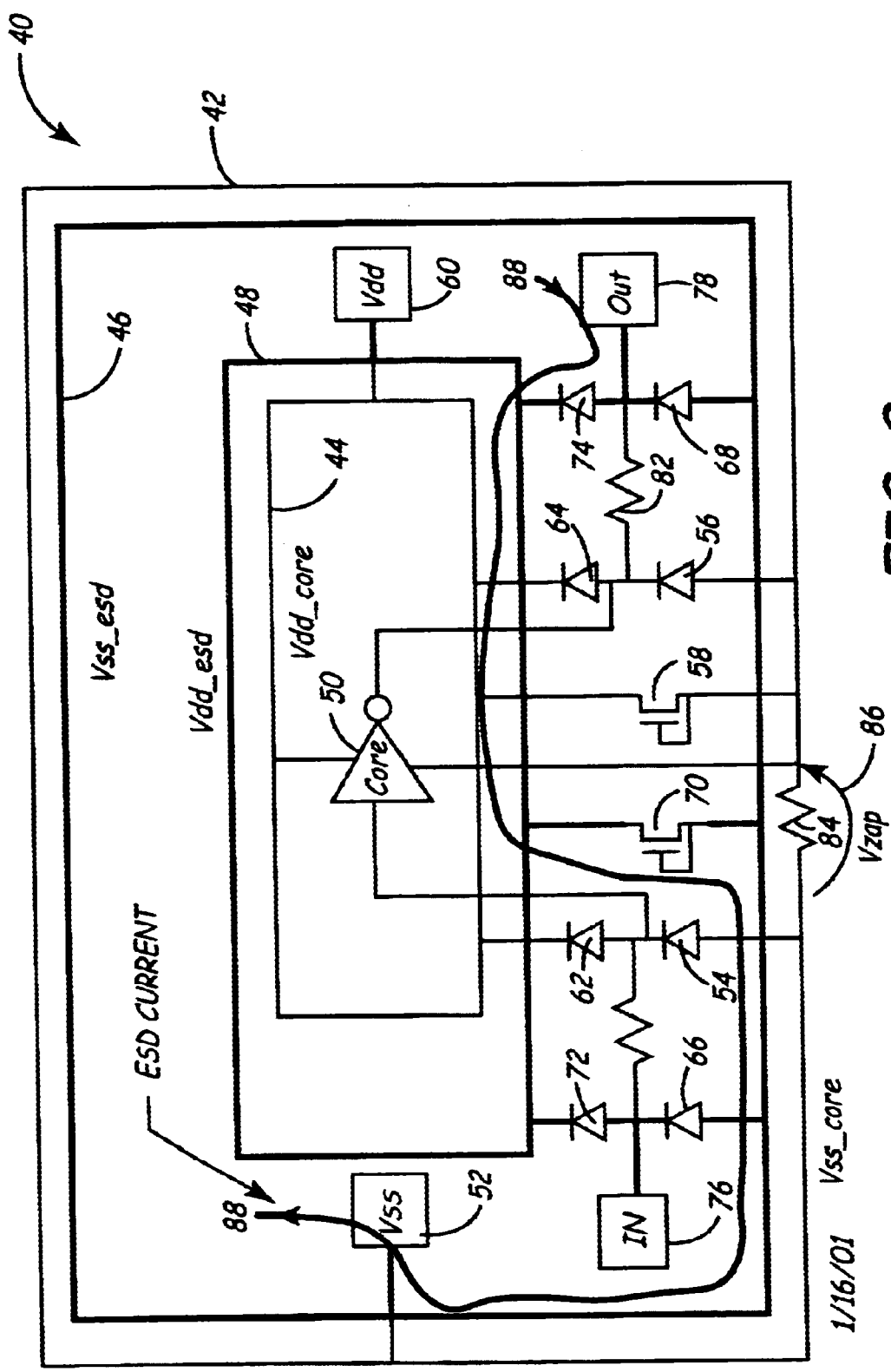
FIG. 2 represents an ESD protection circuit in accordance with the present invention.

Referring now to FIG. 2, an ESD protection circuit 40 is disclosed. The circuit includes $V_{ss}$ core 42, $V_{dd}$ core 44, $V_{ss}$-esd rail 46 and $V_{dd}$-esd rail 48. Power supply rails $V_{ss}$ core 42 and $V_{dd}$ core 44 are divided into $V_{ss}$ core 42 and $V_{ss}$-esd 46 as well s $V_{dd}$ core 44 and $V_{dd}$- ESD 48. This structural scheme enables large ESD current pulses to flow through the wider $V_{ss}$-esd rail 46 and $V_{dd}$-esd rail 48. Accordingly, $V_{ss}$ core 42 and $V_{dd}$ core 48 are isolated from the large ESD current pulses, thereby providing protection for the sensitive devices contained in core circuitry 50.

Further referring to FIG. 2 in more detail, $V_{ss}$ core 42 represents the rail that connects to circuitry 50 via $V_{ss}$ bonding pad 52. Further, $V_{ss}$ core 42 provides operable electrical connection to the anodes of diode 54 and diode 56, as well as to the negative side of esd clamp 58. Similarly, $V_{dd}$ core 44 represents the rail that connects $V_{dd}$ bonding pad 60 to core circuitry 50. Furthermore, $V_{dd}$ core 44 provides connection to the cathodes of diodes 62 and 64, as well as to the positive side of esd clamp 58. $V_{ss}$-ESD 46 represents the rail that connects $V_{ss}$ bonding pad 52 to the anodes of diodes 66 and 68. In addition, $V_{ss}$ ESD 46 provides electrical connection to the negative side of esd clamp 70.

Further referring to FIG. 2, $V_{dd}$-esd rail 48 connects $V_{dd}$ bonding pad 60 to the cathodes of diodes 72 and 74 in addition to providing connections to the positive side of esd clamp 70. Input pad 76 and output pad 78 comprise a part of core circuitry 50 that under the exemplary embodiment of FIG. 2, is protected from large and undesirable ESD currents. It should be noted that both input pad 76 and output pad 78 are protected by similar ESD protection structures (not shown).

Referring now to FIG. 2 in more detail, diodes 66 and 72 conduct large ESD current pulses from $V_{ss}$-esd rail 46 to input pad 76 for negative ESD pulses. Further, input isolation resistor 80 connected between input bonding pad 76 and input of core circuitry 50, diverts the ESD current that is directed by diodes 66 and 70 to esd rails $V_{ss}$ core 42 and $V_{ss}$-esd 46 and away from $V_{dd}$ core 44 to protect core circuitry 50 from both positive and negative ESD pulses. Diodes 54 and 62 direct small ESD currents that flow through input isolation resistor 80 to $V_{dd}$ core 44 for negative and positive ESD pulses respectively. Similarly, diodes 68 and 74 conduct large ESD current pulses from output bonding pad 78 to $V_{dd}$-esd rail 48 for negative and positive ESD pulses respectively.

Output isolation resistor 82 is connected between output bonding pad 78 and the output of core circuitry 50 to divert ESD current to esd rails 46 and 48 for both positive and negative ESD pulses. Small ESD current that flows through output isolation resistor 82 to $V_{dd}$ core rail 44 is conducted via diode 64, representing positive ESD pulses. Further, the negative ESD pulses flowing through isolation resistor 82 are conducted via diode 56. Clamp 70 is preferably a low impedance energy absorbing ESD current path from rail 48 to rail 46 for positive pulses. As is commonly practiced in the art, clamps of the type such as clamp 70 are implemented using a grounded gate N-type metal oxide semiconductor (GGNMOS) snapback device. Similarly, clamp 58 is implemented to provide a low impedance energy absorbing current pad for the small secondary current pulses from $V_{dd}$ core rail 44 to $V_{ss}$ core rail 42 for positive pulses. Resistance 84 represents the resistance of a section of the $V_{ss}$ core 42, and $V_{zap}$ 86 represents the voltage developed across resistor 84.

Regarding the operation and functionality of the present invention as depicted in embodiment FIG. 2, assume a 13 amp esd current pulse 88 entering at output bonding pad 78 and exiting at $V_{ss}$ bonding pad 52. For comparative purposes, a rail resistance of 2 ohms is assumed across resistor 84.

As was discussed hereinabove, in the conventional scheme represented in FIG. 1, Vzap 34 has a value of 60 volts and would yield 30 amps through the two ohm rail resistors 84. In sharp contrast, Vzap 86 has a value of 0.2 volts representing a potential drop caused by a much smaller 0.1 amp through the $V_{ss}$ rail resistance 84. As is well known in the art, a 60 volt (Vzap) developed across a section of $V_{ss}$ rail 42, could cause serious damage to core circuitry 50. This is particularly because connections in core circuitry 50 are at the same potential as $V_{ss}$ rail under normal operations.

Accordingly, the structure of the present invention would reduce destructive ESD damage. Specifically, a 60 volt (Vzap) potential which is shown to be detrimental in prior art ESD circuits, could be reduced to a 0.2 volt Vzap by implementing the ESD protection circuit of the present invention, thus rendering it harmless.

Although a preferred embodiment of the ESD protection system in accordance with the present invention is disclosed, as would be appreciated by those of ordinary skill in the art, a wide variety of modifications may be made in the above-described embodiment while remaining within the scope of the present invention. For example, while the preferred embodiment of the invention has been described in terms of an implementation in a structure including a core IC circuit, it would be appreciated that a wide variety of other types of integrated circuit process technology may advantageously employ the present invention. Further, while the preferred embodiment of the present invention describes a divided rail structure to route large ESD current away from sensitive regions of one or more ICs and circuits. The scheme and structure of the invention could be used in various arrangements to protect sensitive circuitry damage due to ESD pulses.

What is claimed is:

1. An Electrostatic Discharge (ESD) protection system for core circuitry, the system comprising:

core voltage rails coupled with and supplying power to the core circuitry comprising a positive voltage Vdd core rail coupled to a positive supply voltage Vdd and a negative voltage Vss core rail coupled to a negative supply voltage Vss;

electrostatic discharge voltage rails separated from the core voltage rails comprising a positive electrostatic discharge voltage rail Vdd esd coupled with the positive supply voltage Vdd and a negative electrostatic discharge voltage rail Vss esd coupled with the negative supply voltage Vss;

an electrostatic discharge clamp connected between the positive electrostatic discharge voltage rail Vdd esd and the negative electrostatic discharge voltage rail Vss esd;

an input pad and an output pad, input signals being input to the core circuitry from the input pad and output signals being output from the core circuitry from the output pad;

a first input protection circuit connected to the input pad and coupled between the positive electrostatic discharge voltage rail Vdd esd and the negative electrostatic discharge voltage rail Vss esd to divert electrostatic discharge current away from the Vdd core rail to the Vdd esd rail; and a second input protection circuit coupled to the input pad and coupled between the positive voltage Vdd core rail and the negative voltage Vss core rail.

2. The system of claim 1, further comprising:

a first output protection circuit connected to the output pad and coupled between the positive electrostatic discharge voltage rail Vdd esd and the negative electrostatic discharge voltage rail Vss esd; and a second output protection circuit coupled to the output pad and coupled between the positive voltage Vdd core rail and the negative voltage Vss core rail.

3. The system of claim 1, wherein the first input protection circuit comprises:

a first current directing for conducting positive polarity electrostatic discharge currents at the input pad through the positive electrostatic discharge voltage rail Vdd esd and the negative electrostatic discharge voltage rail Vss esd to the negative supply voltage Vss; and a second current directing component for conducting negative polarity electrostatic discharge currents at the input pad through the negative electrostatic discharge voltage rail Vss esd and the positive electrostatic discharge voltage rail Vdd esd to the positive supply voltage Vdd.

4. The system of claim 1, wherein the second input protection circuit comprises:

a first current directing component for conducting positive polarity electrostatic discharge currents at the input pad through the positive core voltage rail Vdd core and the negative core voltage rail Vss core to the negative supply voltage Vss; and a second current directing component for conducting negative polarity electrostatic discharge current at the input pad through the negative core voltage rail Vss core and the positive core voltage rail Vdd core to the positive supply voltage Vdd.

* * * * *